United States Patent [19]

Maruyama et al.

[11] Patent Number: 4,807,356
[45] Date of Patent: Feb. 28, 1989

[54] METHOD OF LOADING PARTS

[75] Inventors: Masahiro Maruyama, Minou; Kazuhiro Mori, Katano; Eiji Itemadani, Sakai; Mikio Hasegawa, Hirakata, all of Japan

[73] Assignee: Matsushita Electric Industrial Co., Ltd., Osaka, Japan

[21] Appl. No.: 4,758

[22] Filed: Jan. 7, 1987

Related U.S. Application Data

[62] Division of Ser. No. 743,860, filed as PCT JP84/00454 on Sep. 20, 1984, published as WO85/01416 on Mar. 28, 1985, abandoned.

[30] Foreign Application Priority Data

Sep. 22, 1983 [JP] Japan ................. 58-175340

[51] Int. Cl.$^4$ ............................. B23P 19/00
[52] U.S. Cl. ........................ 29/740; 29/739; 29/832; 29/837
[58] Field of Search .............. 29/739, 740, 741, 832, 29/834, 837, 838, 839; 310/13, 12; 414/226; 228/180.1, 180.2

[56] References Cited

U.S. PATENT DOCUMENTS

| | | | |
|---|---|---|---|
| 3,453,714 | 5/1965 | Clark et al. | 29/714 |
| 3,656,015 | 4/1972 | Gillum | 310/13 |
| 4,318,145 | 3/1982 | Frandsen | 310/13 |

FOREIGN PATENT DOCUMENTS 57-43393 11/1982 Japan .

Primary Examiner—Howard N. Goldberg
Assistant Examiner—Irene Cuda
Attorney, Agent, or Firm—Wenderoth, Lind & Ponack

[57] ABSTRACT

The present invention is a part mounting device for mounting chip parts on a substrate, comprising a linear motor having a columnar yoke with upper and lower ends thereof pivotably supported on the device, permanent magnets disposed in the vicinity of the columnar yoke and forming with the columnar yoke a magnetic circuit, and a bobbin disposed in the vicinity of the columnar yoke and slidable in the columnar direction of the yoke;

a chip part holder fixedly secured to the bobbin and having a vacuum nozzle for picking up and holding chip parts;

a mechanism connected to said linear motor for controlling the driving of the linear motor for driving the part holder rapidly for moving chip parts quickly from a first position remote from the position of the substrate on which the chip parts are to be mounted to a third position just before the chip parts are on the substrate and then driving the part holder slowly to move the chip parts from the third position to a second position where the chip parts are on the substrate; and a mechanism connected to the yoke for rotating the yoke in a plane transverse to the columnar direction of the yoke.

5 Claims, 9 Drawing Sheets

METHOD OF LOADING PARTS

This application is a division, of application Ser. No. 743,860, filed as PCT JP84/00454 on Sept. 20, 1984, published as WO85/01416 on Mar. 28, 1985, now abandoned.

TECHNICAL FIELD

This invention relates to a part loading method of loading electronic parts (hereinafter referred to as chip-parts) shaped in the form of a chip and the like onto an electronic circuit substrate and the like, and intends to provide a chip-part loading method which makes it possible to control a load at the time of loading the chip-parts in correspondence to a variation in thickness of the chip-parts, change in thickness of the chip-parts depending on their kinds, etc., and permits miniaturization as a whole of and speedup of operation of a device.

BACKGROUND ART

Hitherto, as the method of loading the chip-parts or the like on the substrate forming an electronic circuit, one method has been practiced which loads one after another the chip-parts of one kind, sent to a supply station and positioned thereat by a part supply device, onto the substrate by the use of a pick and place unit.

The conventional example will be described below with reference to FIGS. 1 through 5. In FIG. 1, 1 is a loader device for supplying a substrate 2 automatically, the substrate 2 prepared and placed on the loader device 1 being supplied onto an XY table 4 by means of a substrate conveying pawl 3 and oriented with respect both to an X direction and a Y direction orthogonal to the X direction. 5 is a chip-part loading device, and 6 is a linearly-reciprocatingly-movable chip-part supply section.

Now, the chip-part loading device will be described with reference to FIGS. 2 through 4. In these drawings, 10 is the chip-part placed on the chip-part supply section 6, and 11 is a vacuum nozzle to attract the chip-part 10, which is supported slidably by a shaft 13 via a compression spring 12. The shaft 13 is hollow and is connected through a tube 14 to a vacuum generating source. The shaft 13 is fixed to a shaft 15 which in turn is supported vertically slidably, and moves vertically in response to the movement of a cam 19 via levers 16, 17, 18. 20 is a cam coaxial with the cam 19, and 21, 22 are levers for drive transmission, coupled to a rack 23. 24 is a gear engaging with the rack 23, thus, in response to the crosswise movement of the rack 23 the shaft 13 performs a rotational motion about the shaft 15.

In the foregoing structure, the chip-part 10 on the chip-part supply section 6, after attracted by the vacuum nozzle 11, rises as indicated by the arrow A, moves laterally as indicated by the arrow B, and falls as indicated by the arrow C thereby to be loaded onto the substrate 2. During the foregoing steps, the movement of the vacuum nozzle 11 is controlled by the cam 19 through the shaft 13, shaft 15, levers 16, 17, 18 with respect to the vertical direction, and by the cam 20 through the gear 24, rack 23, levers 22, 21 with respect to the horizontal direction, so that the attracting, moving and loading of the chip-parts are carried out by the composition of motion in both directions.

FIG. 5 is a graph showing the displacement in the loading operation of the chip-part 10 and vacuum nozzle 11 for attraction of the chip-part, performed by the foregoing chip-part loading device, and the loading load. As illustrated in the graph of FIG. 5, the bottom dead point of the vacuum nozzle 11 responsive to the drive cap does not always accord with the substrate 2 due to a variation in thickness of the chip-parts 10 or warp of the substrate 2, thus, as shown by portion A in FIG. 5, an impact load caused by the compression spring 12 and exceeding a set load would be applied to the chip-part 10 irrespective of the vacuum nozzle 11 being urged by the compression spring 19. Further, as shown by portion B in FIG. 5, it was confirmed that the vacuum nozzle 11 exhibits jumping.

As apparent from the foregoing description, the chip-part loading method utilizing the cam drive mechanism had the drawback that the loading motion which should be high in accuracy and reliability can not answer to the thickness and the like of the object chip-parts because the extent of displacement of the cam is fixed. Accordingly, chip-parts able to be loaded were limited in thickness, and cracks would be generated in thin ship-parts. In addition, jumping and the like of the vacuum nozzle were the cause that the degree of accuracy on loading the chip-parts could not be increased sufficiently.

Furthermore, plural cams and motors therefor were needed, other than the movable portions for the vertical and horizontal motions, in order to achieve cam driving, thus, this made it difficult to miniaturize the device as a whole. Still, it was necessary to cause a cam follower to follow the cam, thus, there was the drawback that speedup of the motion could hardly be realized.

DISCLOSURE OF THE INVENTION

This invention is the method of loading parts of a chip shape or the like onto an electronic circuit substrate and the like, whose part loading process, to load the parts onto the circuit substrate by moving a part holding section holding the part from a first position before the part is loaded onto the substrate to a second position where the part abuts on the substrate, comprises the following five steps:

(a) the first step of pre-setting, in correspondence to a kind of parts, the first position and a third position immediately before the part abuts on the substrate in between the first position and the second position, of the part holding section, (b) the second step of moving at high speed the part holding section up to the third position set by the first step, (c) the third step of moving at low speed the part holding section after the second step and causing the part to abut on the substrate, (d) the fourth step of pushing, after the part has abutted on the substrate, the part onto the substrate at a set pressing force for a set time, and (e) the fifth step of moving, after the fourth step, the part holding section from the second position to the first position at high speed, thereby resulting in the peculiar effects that loading of the chip-parts can be performed by setting the operation speed, load, etc., to optimum loading conditions in correspondence to various chip-parts differing in size, material, etc., and its loading operation is alterable by means of a program.

BEST MODE FOR CARRYING OUT THE INVENTION

Figure 1:
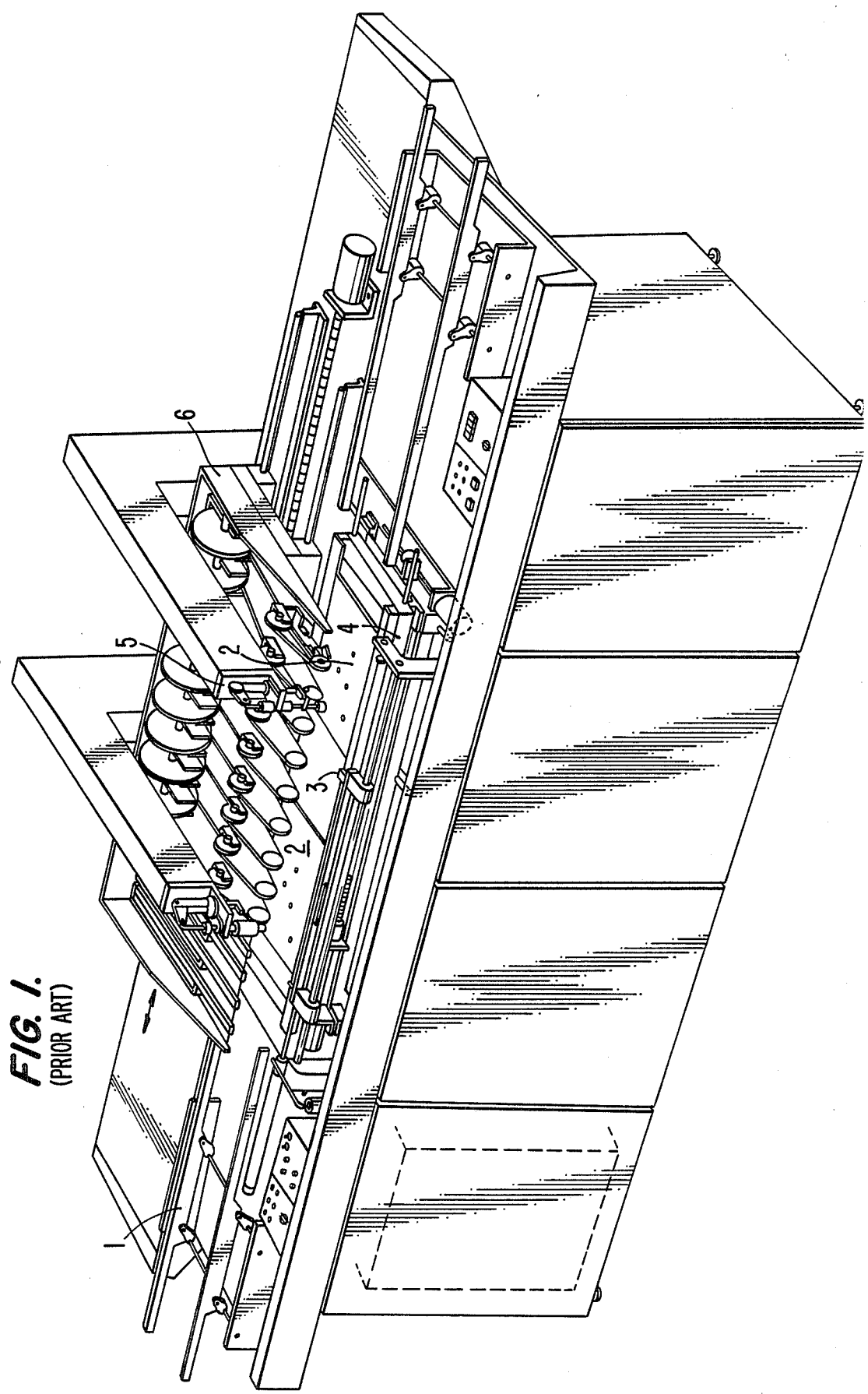
FIG. 1 is a perspective view of the conventional chip-part loading device.
Figure 2:
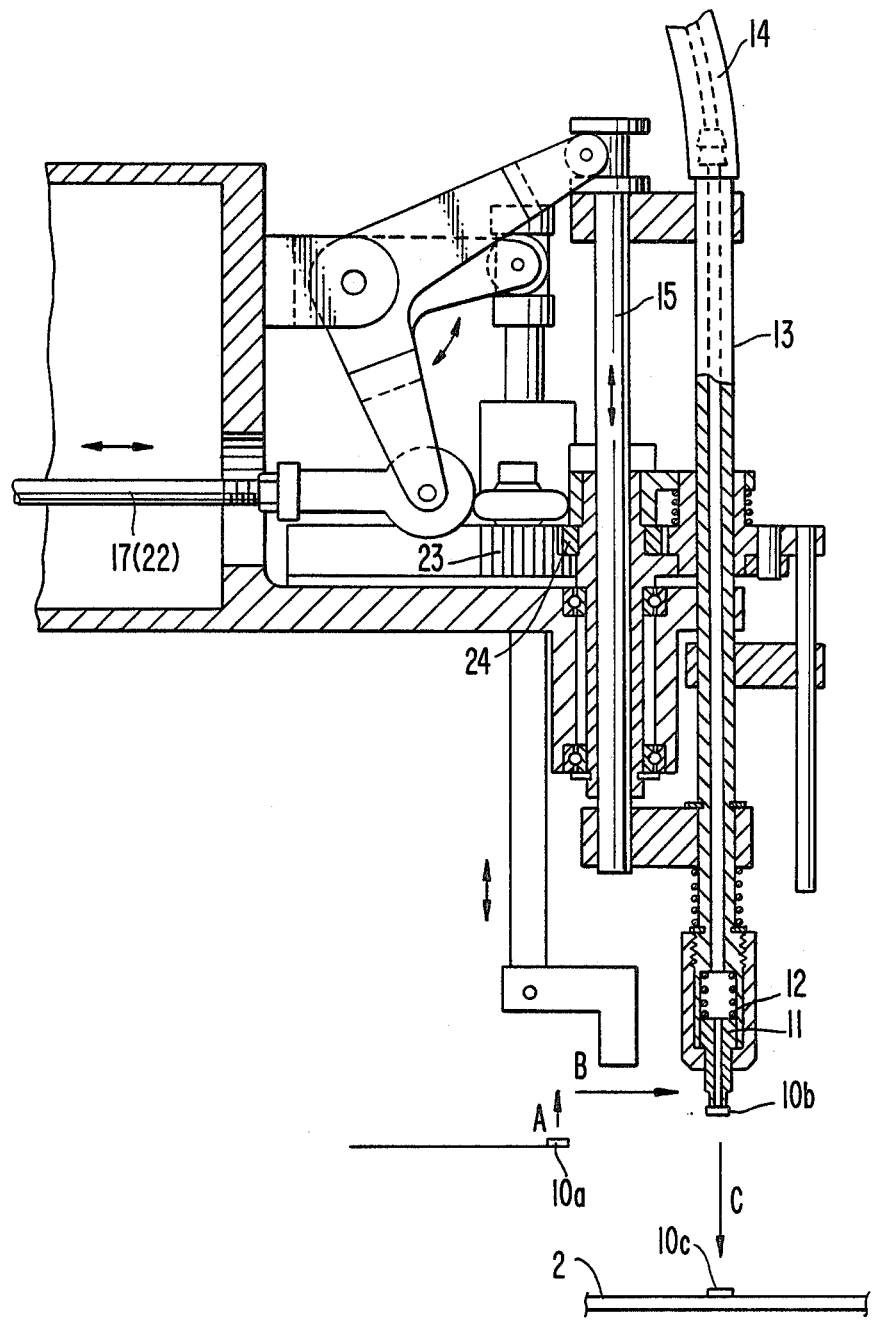
FIG. 2 is a partial sectional view of a head section of the chip-part loading device shown in FIG. 1.
Figure 3:
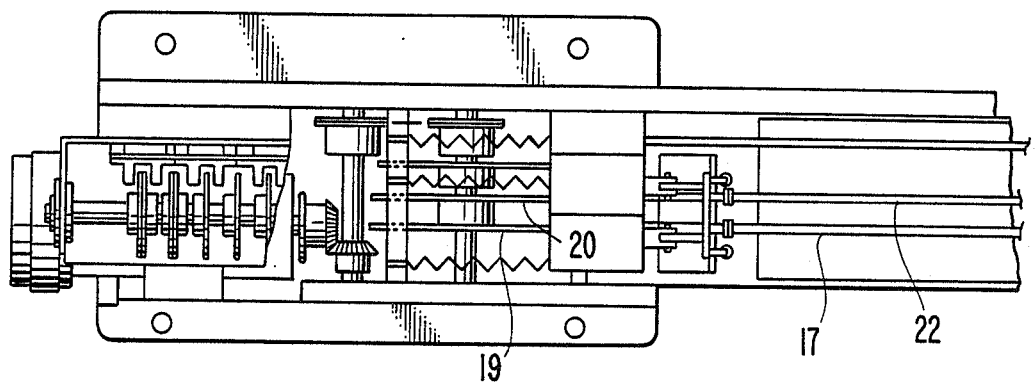
FIG. 3 is a plane view of a drive section of the above loading device.
Figure 4:
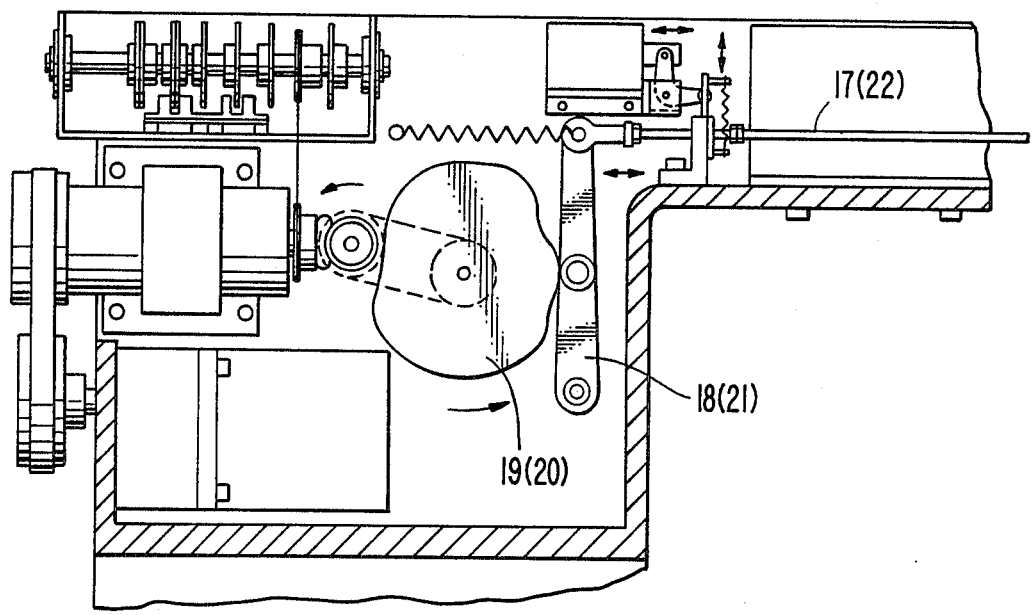
FIG. 4 is a front view of the above.
Figure 5:
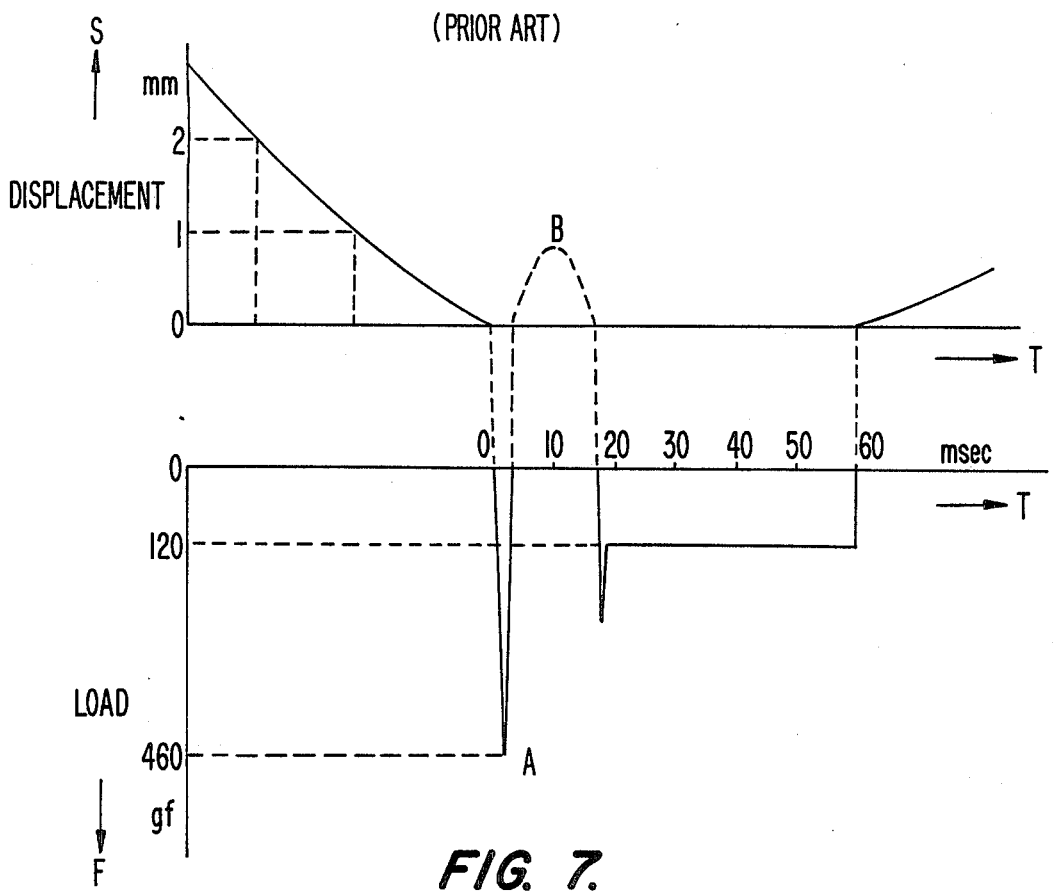
FIG. 5 is a graph showing a load acting on the parts and a falling displacement of a vacuum nozzle relative to the time in the conventional example.
Figure 7:
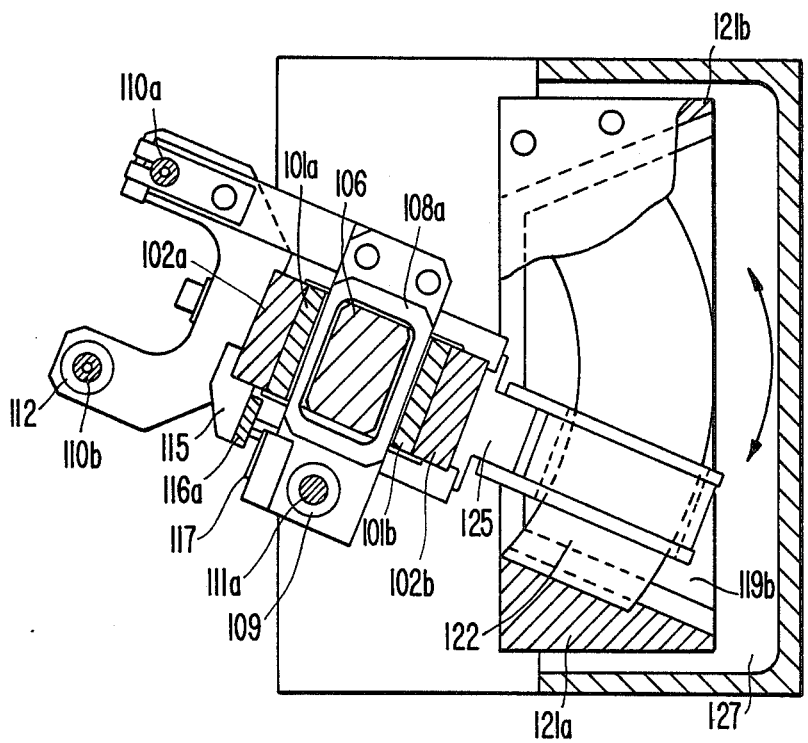
FIG. 7 is a partially sectional plane view of the above.
Figure 6:
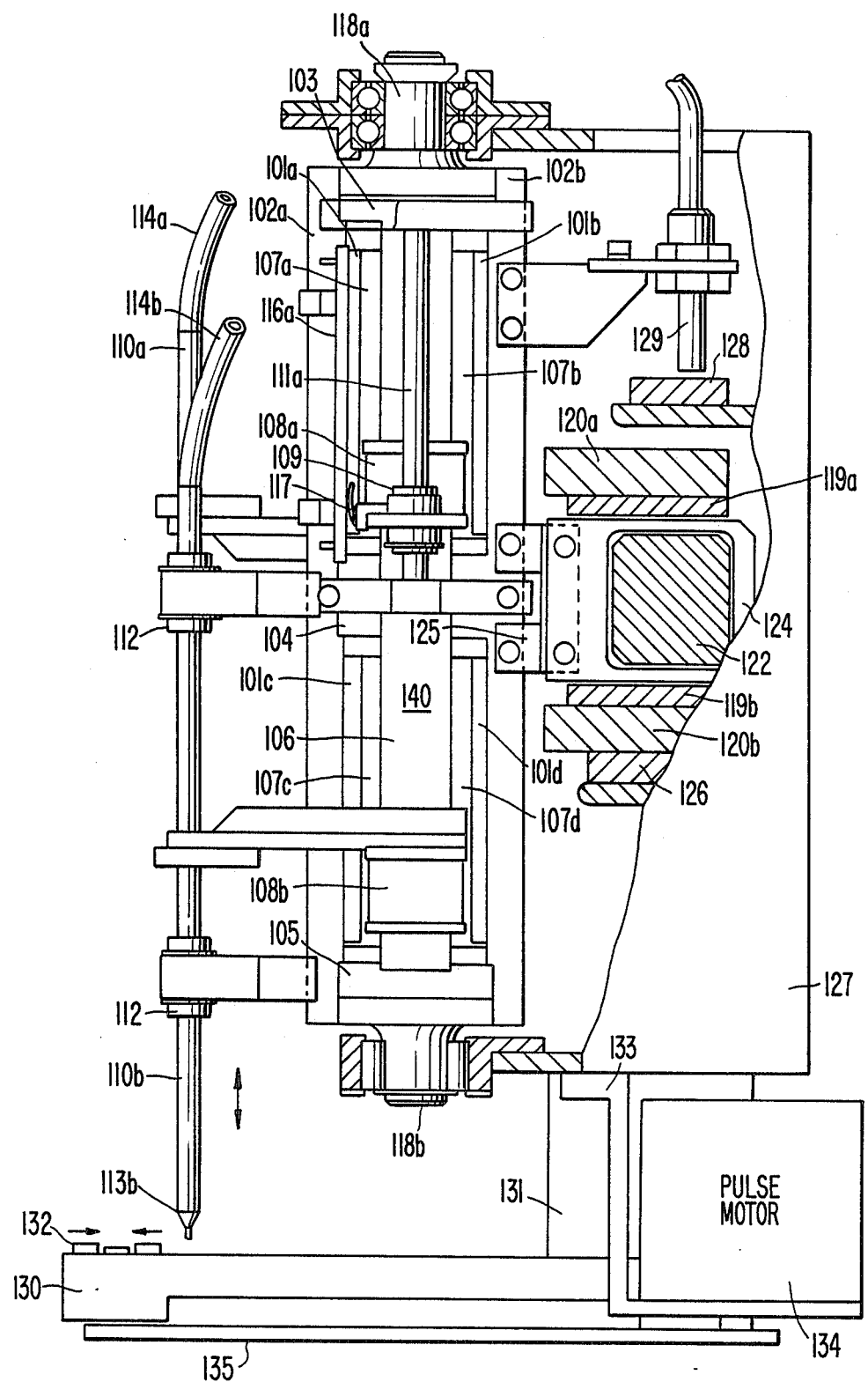
FIG. 6 is a partially sectional front view of one embodiment of the present invention.

One embodiment of the present invention will be described below with reference to the drawings.

FIGS. 6 through 9 illustrate a chip-part loading section according to one embodiment of the present invention. 101a, 101b, 101c, 101d are permanent magnets, and 102a, 102b, 103, 104, 105, 106 are yokes made of material of large permeability, such as pure iron. By the foregoing permanent magnets and yokes a magnetic circuit is formed so that a uniform magnetic field is created in gaps 107a, 107b, 107c, 107c, 108a, 108b are bobbins having wires coiled therearound, which generate thrust as current flows therethrough. To the bobbins 108a, 108b a slice ball bearing 109 and slide shafts 110a, 110b are fixed, the slide ball bearing 109 is supported vertically slidably by slide shafts 111a, 111b, and the slide shafts 110a, 110b are supported vertically slidably by a slide ball bearing 112. To the slide shafts 110a, 110b a part holding section, for example, a chip-part attracting vacuum nozzle 113, is fixed, the upper ends of these slide shafts having tubes 114a, 114b attached thereto for connection to a vacuum generating device. As a position detector in vertical movement of the bobbins 108a, 108b, linear potentiometers 116a, 116b are attached to the yokes 102a, 102b via a bracket 115, and to the bobbins 108a, 108b a brush 117 is attached. To the yokes 102a, 102b shaft ends 118a, 118b are attached which are supported rotatably so as to function as two ends shafts of a linear motor of the foregoing structure.

Now, the structure of a circular-arc motor causing a horizontal motion will be described. 119a, 119b are permanent magnets magnetized so that their magnetic poles oppose mutually, 120a, 120b, 121a, 121b, 122 are yokes made of material of large permeability, such as pure iron. By the foregoing permanent magnets and yokes a magnetic circuit is formed so that a uniform magnetic field is created in gaps 123a, 123b. 124 is a bobbin having a wire coiled therearound, which generates thrust as current flows therethrough. Because the bobbin 124 is fixed via a bracket 125 to the yoke 102b of the vertical linear motor, it performs a circular-arc motion about the shaft ends 118a, 118b. For the above, the yoke 122 is shaped in the form of a circular arc, and the permanent magnets 119a, 119b and yokes 120a, 120b are shaped in such a way that a uniform magnetic field is created in gaps 123a, 123b within the extent of a stroke required for the circular-arc movement. The yoke of this circular-arc motor is fixed via a spacer 126 made of non-magnetic material to a body 127 so as not to cause a magnetic flux to leak. To the body 127 a block 128 whose inclined surface is machined precisely is attached, thus, its position in the direction of the circular arc can be detected by a gap sensor 129 fixed to the yoke 102b of the vertical linear motor.

130 is a body of a part position regulating section, fixed to the body 127 via a bracket 131. 132 is the part position regulating section to regulate mechanically the position of parts, which is supported rotatably by the part position regulating section body 130. The part position regulating section 132 is coupled through a timing belt 135 to a pulse motor 134 fixed via a bracket 133 to the body 127, so that it can rotate and be set to an arbitrary angle up to 360°.

The operation of the chip-part loading section composed as described above will be described below.

Figure 9:
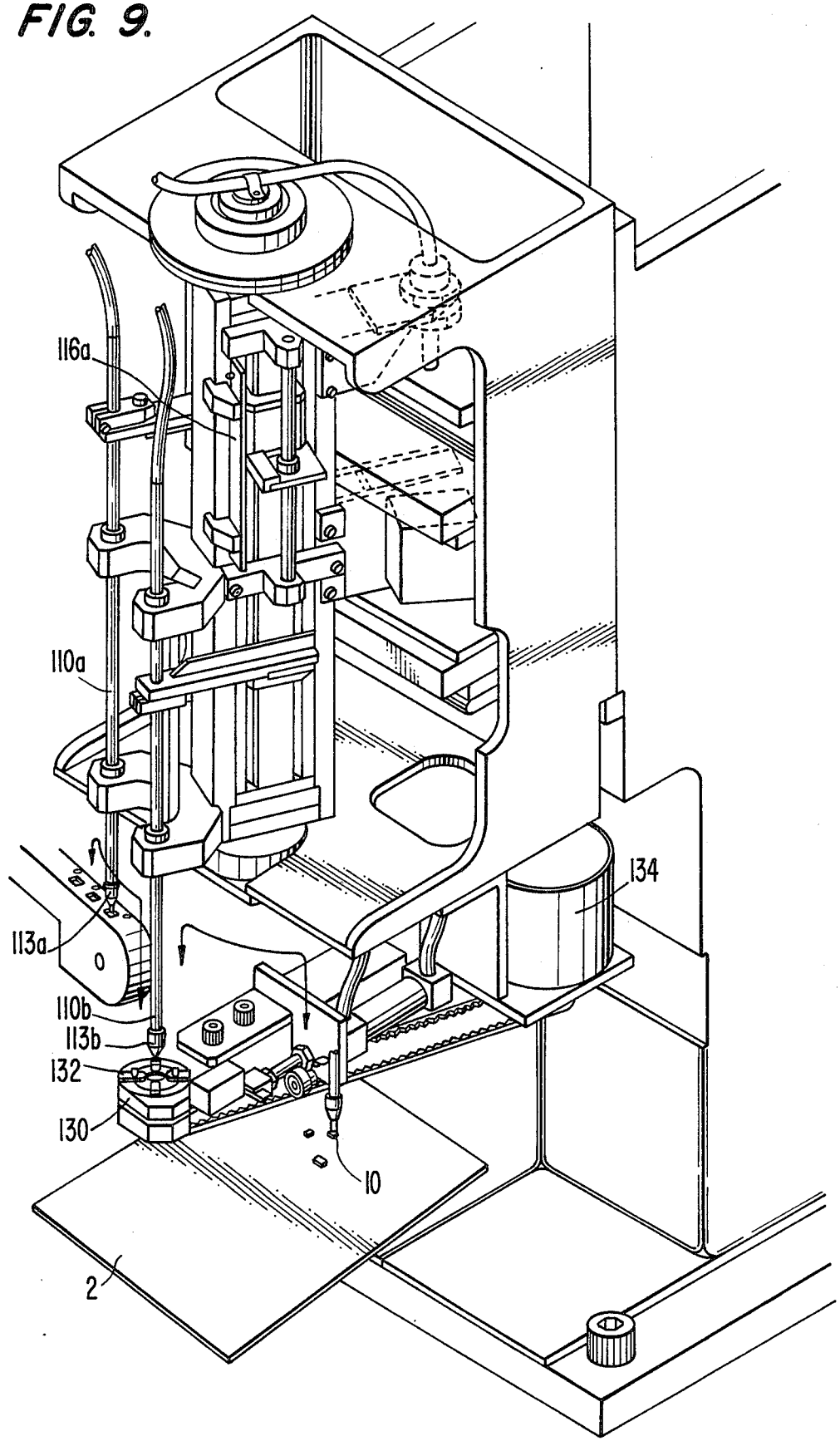
FIG. 9 is a perspective view of the above.

The foregoing circular-arc motor repeats a rotational reciprocative motion in the extent of 45°, during which the slide shaft 110a transfers the part from the part supply section to the part position regulating section 132, and the slide shaft 110b transfers the part from the part position regulating section 132 to the substrate (FIG. 9).

Figure 10:
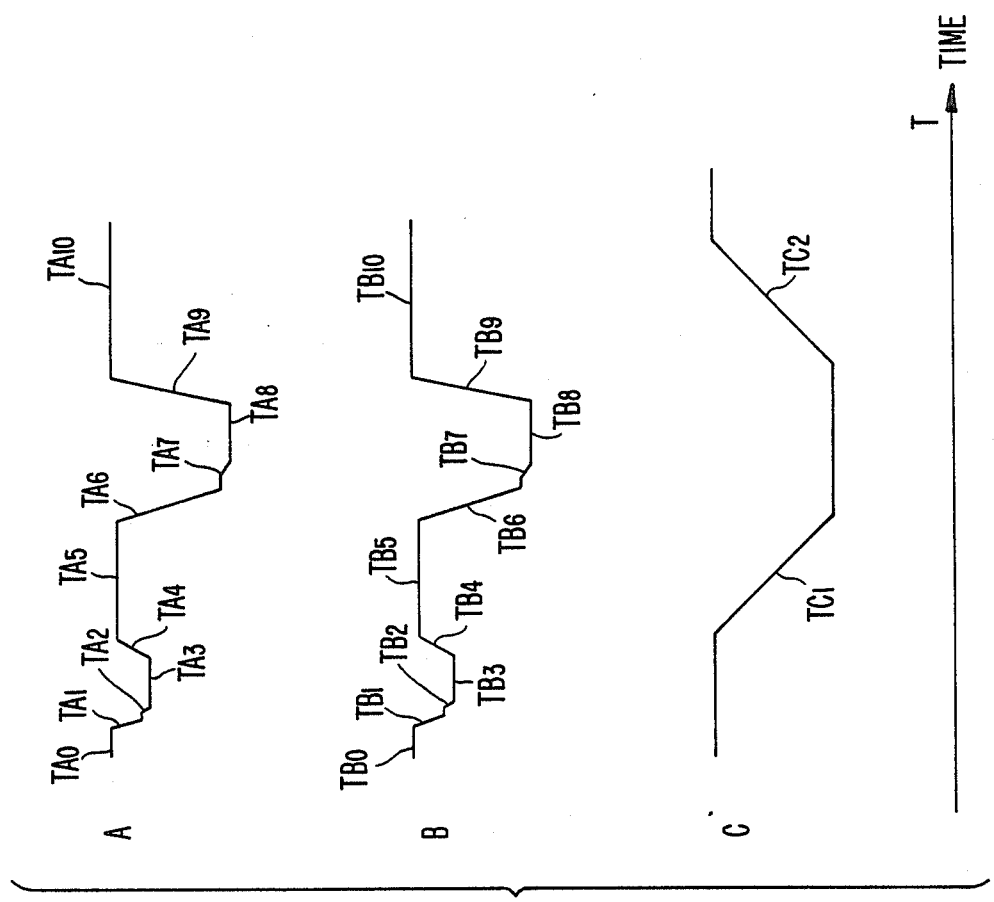
FIG. 10 is a timing chart diagram of a loading section of the above.
Figure 8:
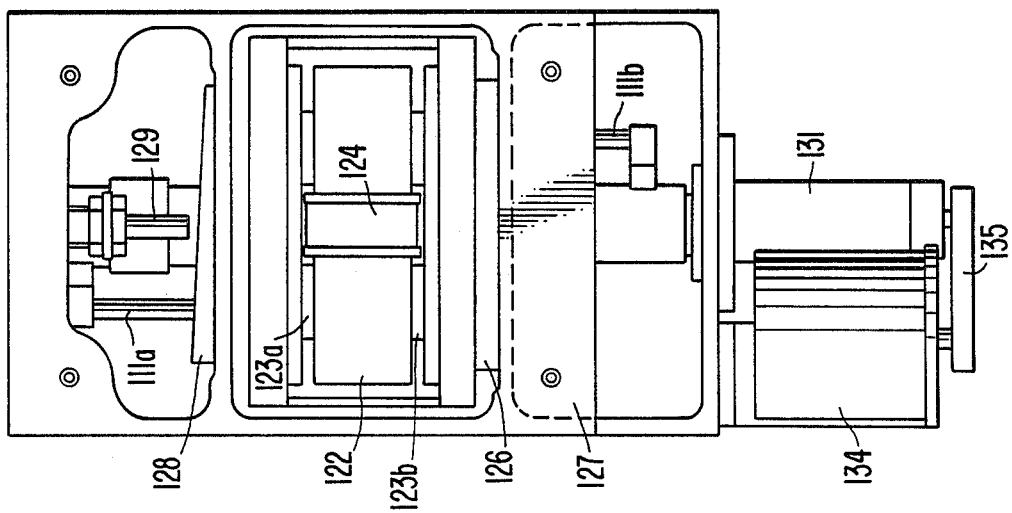
FIG. 8 is a right-hand side view of the above.

FIG. 10 is the timing chart of the chip-part loading section, wherein the ordinates of curves (A), (B) represent the heights of the slide shafts 110a, 110b, the ordinate of curve (C) represents the angle of the circular-arc motor, and the abscissa for all of curves (A), (B), (C) represents the time.

$TA_0$ represents an origin position state of the slide shaft 110a, and, in response to a position command given to the linear motor, the slide shaft 110a passes through a step $TA_1$ of falling to attract the chip-part, a speed control step $TA_2$ of making uniform a collision speed against the chip-part, a step $TA_3$ of attracting the chip-part, and a step $TA_4$ of rising and positioning to raise the attracted chip-part up to a conveying position, and comes to a conveying position state $TA_5$. During the above, as indicated by $TC_1$ in timing chart curve (C), the circular-arc motor rotates through 45° and is positioned thereat, so that the chip-part has been conveyed. After the completion of conveying, a process of loading the chip-part onto the part position regulating section will take place. The slide shaft 110a passes through a step $TA_6$ of falling to load the chip-part, a speed control step $TA_7$ of making uniform a collision speed against the chip-part, a step $TA_8$ of loading the chip-part, and a step $TA_9$ of rising to attract a next chip-part, and comes to an origin position state $TA_{10}$. During the above, the circular-arc motor rotates through 45° in the opposite direction ($TC_2$) to the case of conveying the chip-part and is positioned thereat, whereby one cycle of attracting, conveying and loading of the chip-part from the part supply section to the part position regulating section is completed.

Now, the process of loading the chip-part positioned at the part position regulating section onto the substrate will be described. Because the slide shaft 110a for transferring the chip-part from the part supply section to the part position regulating section and the slice shaft 110b for transferring the chip-part from the part position regulating section to the substrate utilize the same circular-arc motor for the operation of horizontal transfer, both slide shafts 110a, 110b are fundamentally synchronized with each other. Accordingly, the respective steps $TA_0$–$TA_{10}$ of the slide shaft 110a correspond to the respective steps $TB_0$–$TB_{10}$ of the slide shaft 110b. However, because there are provided the vertical linear motors independently for the respective slide shafts, it is possible to convey the chip-part under optimum conditions during the respective steps $TA_0$–$TA_{10}$, $TB_0$–$TB_{10}$, and it is also possible to select optimum conditions for the respective steps in correspondence to a variation in shape (for example, in thickness) of the chip-parts.

Figure 11:
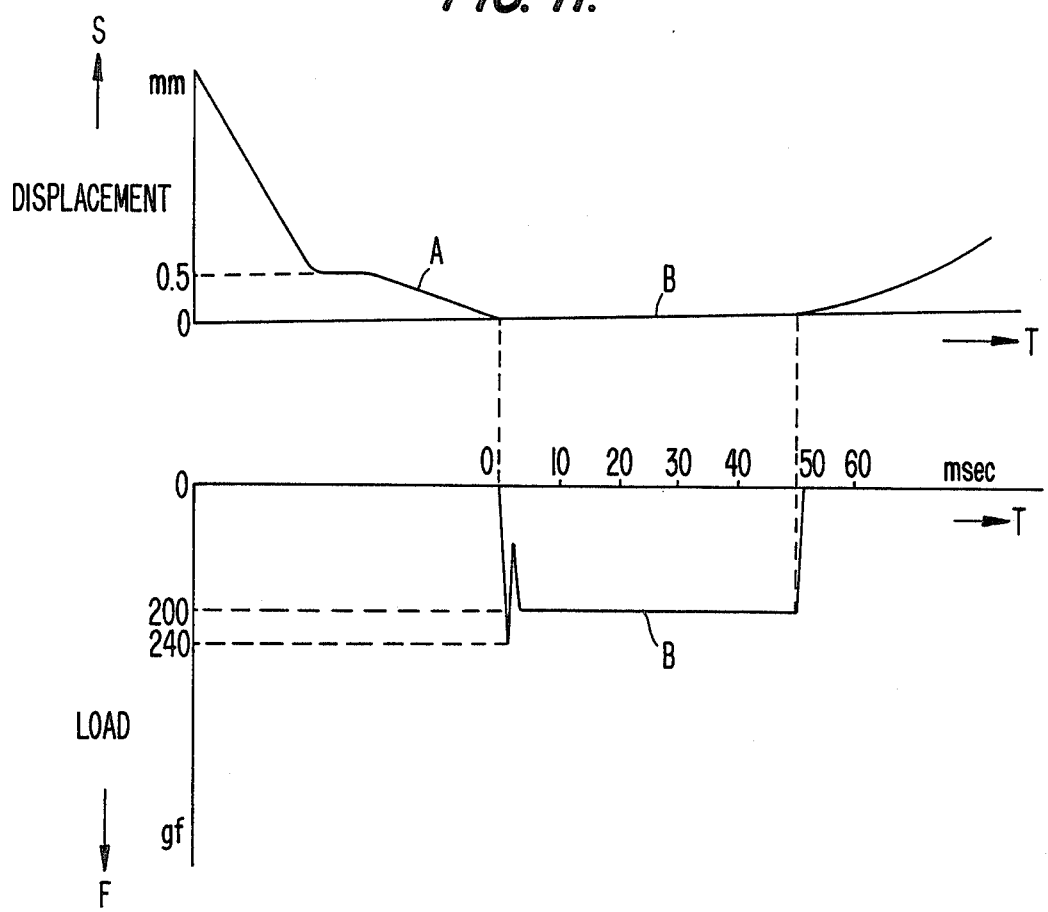
FIG. 11 is a graph showing a load acting on the parts and a falling displacement of a vacuum nozzle relative to the time in one embodiment of the present invention.

FIG. 11 is the graph showing the position of the vacuum nozzle and the load acting on the chip-part at the time of loading the chip-part, and, because loading of the chip-part is performed during the speed control step (see portion A) of making uniform a collision speed, the load against the chip-part can be controlled to an appropriate extent (see portion B), not to the impact load. Thus, it becomes possible to load the chip-part at an appropriate load through setting the speed control step correspondingly to variations in thickness and material of the object chip-parts, in height of the substrate, and the like.

For horizontal conveying of the chip-parts, a swing type linear motor made up of the yokes 120, 121, 122, magnet 119 and bobbin 124 is used, which is the best suited driving source that can achieve positioning accurately at either end of the extent of a swing angle of 45°, gives a high moving speed in between the moving limits and is small itself in size. Further, a control system for this motor may be of the same type as that of the vertical linear motor for the two shafts, thus, there is the advantage that the control section of the chip-part loading section can take a modularized structure.

Figure 12:
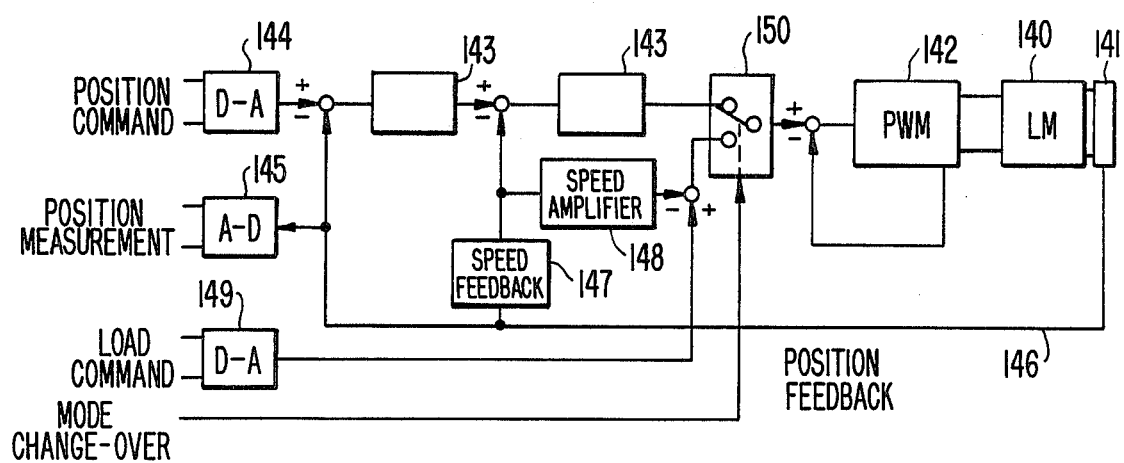
FIG. 12 is a block diagram of a linear motor and its control system in the present invention.

FIG. 12 is the block diagram of the linear motor for controlling directly the slide shaft-110a or 110b, and its control system. In this drawing, 140 is the linear motor, 141 is the position sensor for the linear motor 140, and 142 is a power amplifier for driving the linear motor 140. 143 is a pre-amplifier, 144 is a D-A converter of the position command, 145 is an A-D converter of a position feedback 146, 147 is a differentiating circuit, and 148 is a speed amplifier. 149 is a D-A converter of a load command, and 150 is a change-over switch for switching between a positioning mode and a load mode. In such a control system as above, by turning the mode change-over switch 150 to the positioning mode, the positioning step illustrated in the timing chart of FIG. 10 is controlled, whereas by turning the mode change-over switch 150 to the load mode, the speed control steps ($TA_7$, $TA_2$, $TB_2TB_7$) and/or the step ($TB_3$ or $TB_8$) of attracting or loading the part are controlled. Further, because the speed obtained by the differentiating circuit 147 is fed back to the speed amplifier 148, a uniform motion is secured in the speed control step illustrated in FIG. 11 (see portion A), the impact strength when the chip-part comes into contact with the circuit substrate while the part is loaded is suppressed to the smallest, the command from the speed amplifier 148 becomes zero when and after the speed feedback changes to zero, and the step (see portion B) where an appropriate uniform load is applied to the chip-part due to the load command can be controlled.

Figure 13:
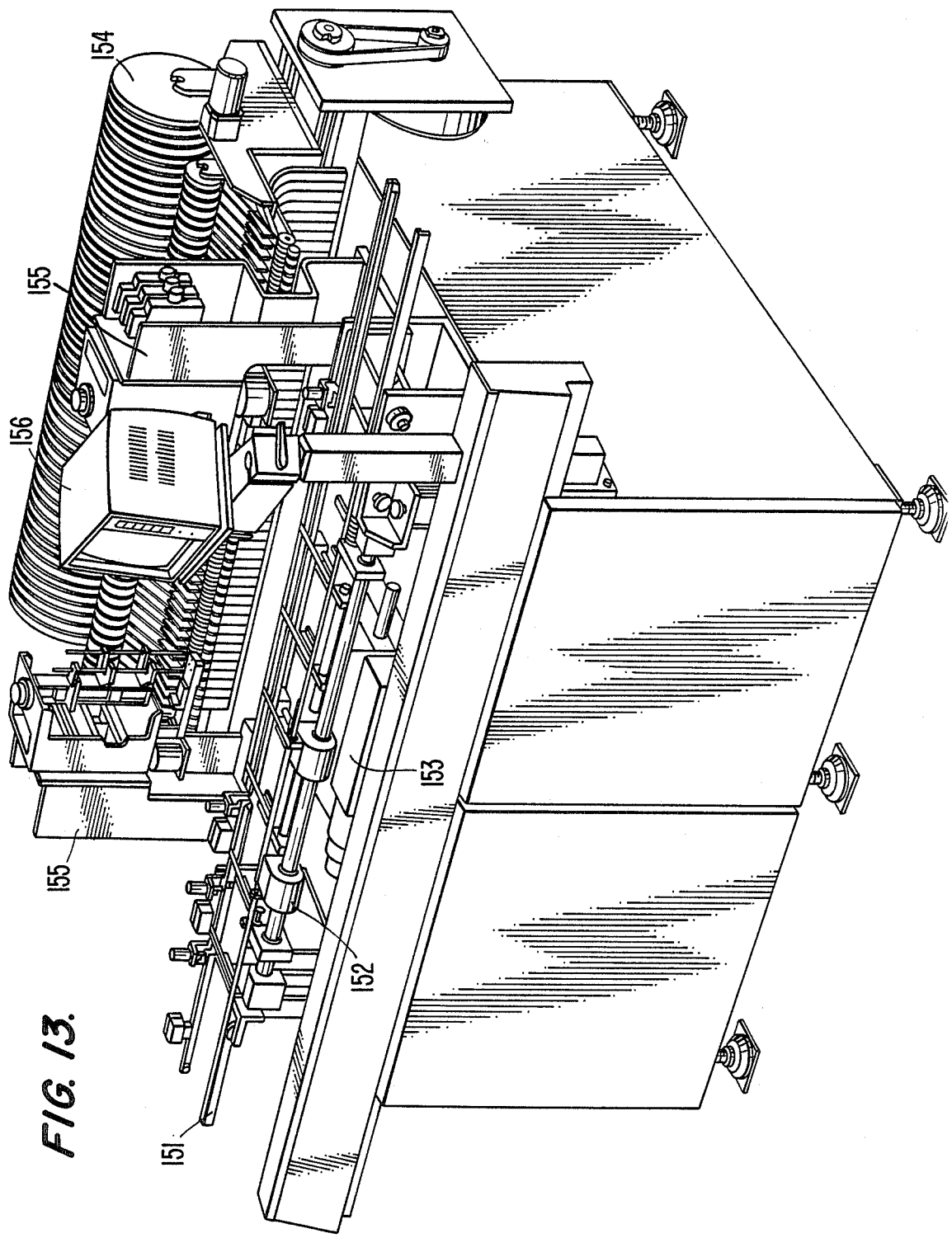
FIG. 13 is a perspective view of a chip-part loading device according to the one embodiment of the present invention.

FIG. 13 illustrates a chip-part loading machine equipped with the foregoing chip-part loading section. 151 is a loader device for supplying automatically the substrates, 152 is a substrate conveying pawl, 153 is an XY table which can shift relatively the substrate with respect to the chip-part loading section, 154 is a chip-part supply section which can move linearly and reciprocatingly, and 155 is the foregoing chip-part loading section. In this embodiment, there are disposed the two chip-part loading sections 155 laterally symmetrically and they load the chip-parts simultaneously, thus, the productivity increases to two times that of a machine equipped with one chip-part loading section. 156 represents a control panel for the chip-part loading machine and a monitor television for displaying various messages.

Though in the foregoing embodiment the machine having the two chip-part loading sections has been disclosed, it is possible to compose a chip-part loading device by a combination of the chip-part loading section and a device of applying an adhesive to secure temporarily the chip-parts or a device of applying creamy solder.

INDUSTRIAL APPLICABILITY

As apparent from the foregoing, the present invention can load various chip-parts differing in size, material, etc. through setting the operation speed, load, etc. to optimum loading conditions in correspondence thereto by controlling the operation speed in each step and/or transition points between successive steps in accordance with the command from a control section.

Accordingly, there results in the practical effect that the reliability on loading the chip-parts is high and the loading operation is alterable in accordance with a program.

What is claimed is:

1. A part mounting device for mounting chip parts on a substrate, comprising:
    a linear motor having a columnar yoke means with upper and lower ends thereof pivotably supported on said device, permanent magnets disposed in the vicinity of said columnar yoke means and forming with said columnar yoke means a magnetic circuit, and a bobbin disposed in the vicinity of said columnar yoke means and slidable in the columnar direction of said yoke means;
    a chip part holder fixedly secured to said bobbin and having a vacuum nozzle for picking up and holding chip parts;
    means connected to said linear motor for controlling the driving of said linear motor for driving said part holder rapidly for moving chip parts quickly from a first position remote from the position of the substrate on which the chip parts are to be mounted to a third position just before the chip parts are on the substrate and then driving said part holder slowly to move the chip parts from the third position to a second position where the chip parts are on the substrate; and
    means connected to said yoke means for rotating said yoke means in a plane tranvserve to the columnar direction of said yoke means.

2. A part mounting device as claimed in claim 1 in which said chip part holder is secured on said bobbin.

3. A part mounting device for mounting chip parts on a substrate, comprising:
    a first linear motor having a columnar yoke means with upper and lower ends thereof pivotably supported on said device for rotation around an axis of rotation, permanent magnets disposed in the vicinity of said columnar yoke means and forming with said columnar yoke means a magnetic circuit, and a bobbin disposed in the vicinity of said columnar yoke means and slidable in the columnar direction of said yoke means;

a chip part holder fixedly secured to said bobbin and having a vacuum nozzle for picking up and holding chip parts;

means connected to said first linear motor for controlling the driving of said linear motor for driving said part holder rapidly in the columnar direction of said columnar yoke means for moving chip parts quickly from a first position remote from the position of the substrate in which the chip parts are to be mounted to a third position just before the chip parts are on the substrate and then driving said part holder slowly to move the chip parts from the third position to a second position where the chip parts are on the substrate;

a second linear motor having an arcuate yoke means fixedly secured to said device coaxially with the axis of rotation of said columnar yoke means, further permanent magnets disposed in the vicinity of said arcuate yoke means and forming with said arcuate yoke means a further magnetic circuit, and a second bobbin fixedly secured to said columnar yoke means; and further means connected to said second linear motor for controlling said linear motor for rotating said columnar yoke means around said axis of rotation.

4. A part mounting device as claimed in claim 3 in which said chip part holder is secured on said bobbin and said second bobbin is secured on said columnar yoke means.

5. A part mounting device comprising:

a columnar yoke;

permanent magnets disposed in the vicinity of said columnar yoke and, together with said columnar yoke, constituting a magnetic circuit;

a bobbin vertically slidable along said columnar yoke, and together with said columnar yoke and permanent magnets, constituting a linear motor;

a part attracting vacuum nozzle on said bobbin and vertically shifted by said bobbin;

a means for controlling the driving of said linear motor; and a means for shifting said linear motor and part attracting vacuum nozzle in a horizontal plane.

* * * * *